United States Patent [19]
Kirn

[11] Patent Number: 5,610,553
[45] Date of Patent: Mar. 11, 1997

[54] SWITCHING AMPLIFIER WITH IMPEDANCE TRANSFORMATION OUTPUT STAGE

[76] Inventor: Larry Kirn, 7158 Valley Brook, West Bloomfield, Mich. 48322

[21] Appl. No.: 513,780

[22] PCT Filed: Mar. 2, 1994

[86] PCT No.: PCT/US94/02279
§ 371 Date: Aug. 31, 1995
§ 102(e) Date: Aug. 31, 1995

[87] PCT Pub. No.: WO94/21036
PCT Pub. Date: Sep. 15, 1994

[51] Int. Cl.⁶ .................................................. H03F 3/38
[52] U.S. Cl. .................................... 330/10; 330/251
[58] Field of Search .......................... 330/10, 207 A, 330/251; 323/282; 363/16

[56] References Cited

U.S. PATENT DOCUMENTS 4,347,474  8/1982  Brooks et al. .................. 323/282 X
5,479,337  12/1995  Voight .............................. 330/10 X

*Primary Examiner*—Steven Mottola
*Attorney, Agent, or Firm*—Gifford, Krass, Groh, Sprinkle, Patmore, Anderson & Citkowski

[57] ABSTRACT

A broadband switching amplifier utilizes an output stage capable of variable impedance transformation in addition to conventional controlled pulsewidth coupling to accurately produce outpout power without regard for normal power supply or load impedance constraints. In a preferred embodiment, the present invention charges and discharges a reactance (406) with gated switches (404, 405, 407, 408) in accordance with pulsewidth-modulated signals representative of an input signal. For voltage amplification the reactance is inductive, whereas for current amplification, the reactance is capacitive.

20 Claims, 4 Drawing Sheets

SWITCHING AMPLIFIER WITH IMPEDANCE TRANSFORMATION OUTPUT STAGE

TECHNICAL FIELD

This invention relates to broadband switching amplifiers and in particular to an amplifier that utilizes an output stage capable of variable impedance transformation in addition to conventional controlled pulsewidth coupling.

BACKGROUND OF THE INVENTION

This invention relates to a class of broadband power amplifiers that can accurately produce output power without regard for normal power supply or load importance constraints. Analog amplifier designs historically have relied upon the principle of coupling a fixed power supply to a load impedance via elements exhibiting variable conductance. This is accomplished with a variety of devices, all of which perform the function of a valve. Accurate control of the output voltage or current can be achieved, but the amplifier must rely upon a voltage/current transformation device in order to exceed either the voltage or current limitations of the power supply when driving a non-ideal load impedance. The load impedance driven by many power amplifiers is often widely variable on a static and/or dynamic basis. In addition to manufacturing and environmental factors, load impedances in many applications are highly frequency-dependent. In that most existing power amplifiers control output voltage or current only, this limits output power accuracy to that of the driven load.

The advent of switching amplifier designs has improved efficiency. However, these designs have largely substituted pulsewidth modulation for variably-conductive coupling, and have therefore been subject to the same power supply constraints of their analog predecessors.

In applications where a limited or non-optimum power supply voltage or current is available to drive a fixed load impedance, existing amplifier designs require the use of voltage-transforming devices in order to provide the desired output power to the load impedance. These devices usually take the form of output transformers or voltage-transforming power supply sections which increase the voltage or current available to the output stage. Amplifiers designed with such output transformers can be plagued with frequency and phase distortion problems, as well as weight and size penalties. Transformer losses also limit the overall efficiency. Voltage-transforming power supplies may not impact size and weight appreciably, but significantly reduce system efficiency and reliability due to increased circuit complexity.

U.S. Pat. No. 4,180,782 uses an autotransformer in conjunction with a pair of output transistors to increase the output voltage in an analog power amplifier. However, the technique shown is limited to an output voltage twice that of the power supply, with efficiency no better than that typical of analog power amplifiers. There still exists a need for a class of amplifier that efficiently and accurately produces an output power without regard for normal power supply or load impedance constraints. The present invention provides such an amplifier by incorporating the impedance transformation function described above directly in the amplifier output stage, thereby improving system efficiency and reliability while reducing weight, size, and complexity. The approach provides capability of furnishing a controlled output power, in addition to more conventional voltage or current control. To accomplish these objectives, the present invention moves away from the traditional approach of variable coupling between the power supply and load impedance.

SUMMARY OF THE INVENTION

The present invention is a switching amplifier output stage capable of performing a variable impedance transformation on an input signal and coupling the resultant output power to a load impedance. The invention is adapted for use with one or more power supplies and a pulsewidth convertor operative to generate pulsewidth-modulated signals representative of the input.

In a preferred embodiment, the present invention comprises a reactance have a first terminal and a second terminal, a first gated switch operative to transfer energy from the positive power supply to the reactance, a second gated switch operative to transfer energy from the negative power supply to the reactance, and a coupling circuit operative to transfer at least a portion of the energy stored in the reactance to the load impedance. The gated switches and the coupling circuits are all controlled by the pulsewidth convertor using signals representative of the input signal.

In the preferred embodiment, the reactance is an inductance to facilitate voltage amplification. Alternatively, the reactance is a capacitance to facilitate current amplification. The coupling circuit can be balanced or unbalanced, bridged or unbridged. For example, in the preferred embodiment the coupling circuit comprises a third gated switch operative to transfer energy from the first terminal of the reactance to the load impedance and a fourth gated switch operative to transfer energy from the second terminal of the reactance to the load impedance. These gated switches are also controlled by signals generated by the pulsewidth convertor. It should be noted that with proper timing, or with a reactance of zero, the present invention provides amplification by conventional controlled pulsewidth modulation.

DETAILED DESCRIPTION OF THE INVENTION

Figure 1B:
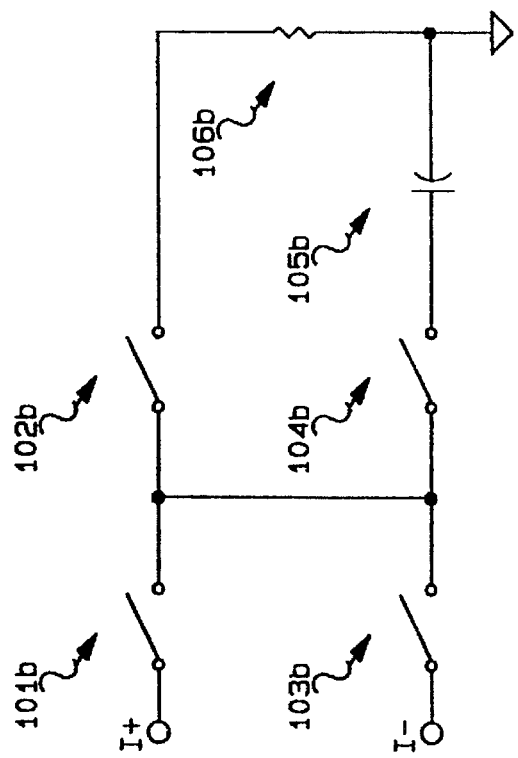
FIG. 1B depicts a schematic representation of the present invention utilizing a capacitance for current amplification.
Figure 1A:
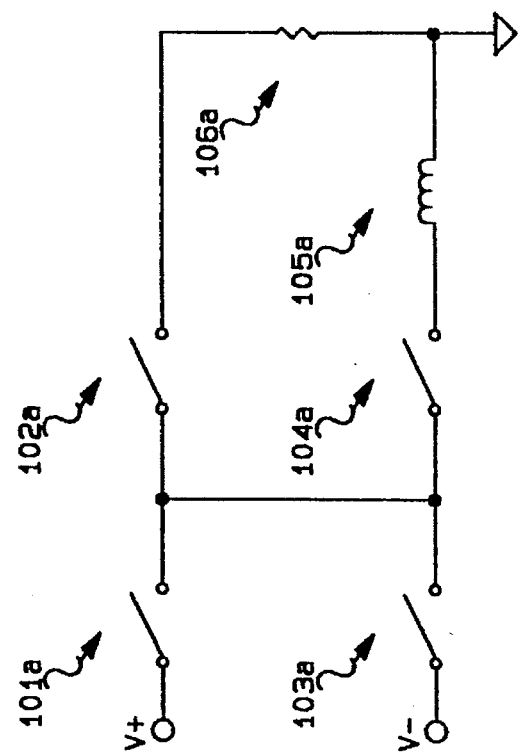
FIG. 1A depicts a schematic representation of the present invention utilizing an inductor to obtain voltage amplification.

The features and operation of the present invention will become evident with reference to the figures. As illustrated in FIG. 1, in its most basic embodiment, the present invention may be implemented with four switching devices 101, 102, 103, and 104 plus a reactance 105. FIG. 1A shows reactance 105 as an inductor 105a to effectuate voltage amplification to lead impedance 106a whereas FIG. 1B shows reactance 105 as a capacitor 105b to effectuate current amplification to lead impedance 106b.

Figure 2:
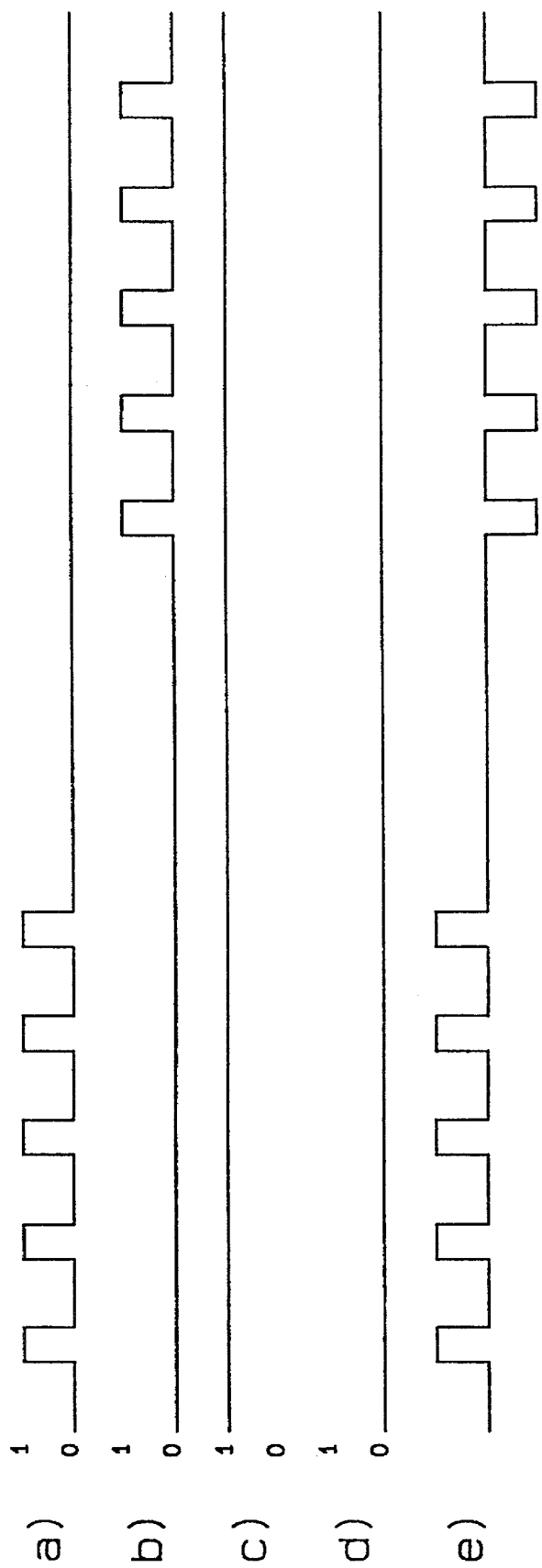
FIG. 2 shows relative switching timing when the present invention is used for conventional pulsewidth modulation.

Before describing how reactance 105 may be used for variable impedance transformation, FIG. 1 will be used to show conventional controlled-pulsewidth coupling. FIG. 2 shows relative switching timing for this application. Waveforms A and B represent activation of devices 101 and 103 in FIG. 1, respectively. A logic 1 shows assertion of the associated device and a logic 0 shows a lack thereof. Waveforms C and D represent activation of devices 102 and 104 respectively, in FIG. 1, and waveform E in FIG. 2 represents energy of the designated polarity available for transfer to load impedance 106. Note that switching device 102, as shown in waveform C, remains asserted; and that switching device 104, as shown in waveform D, remains unasserted. This operational mode is used when the desired output is within power supply voltage/current limitations.

Continuing the reference to FIG. 2, device 101 is pulsed with device 102 asserted, causing waveform A to be transferred to load device 106 as indicated in waveform E. Similarly, when device 103 is pulsed with device 104 asserted, negative-going pulses are available for transfer to load device 106 as indicated in the right hand portion of waveform E in FIG. 2. Reactance 105 is rendered ineffectual by switching device 104.

Figure 3:
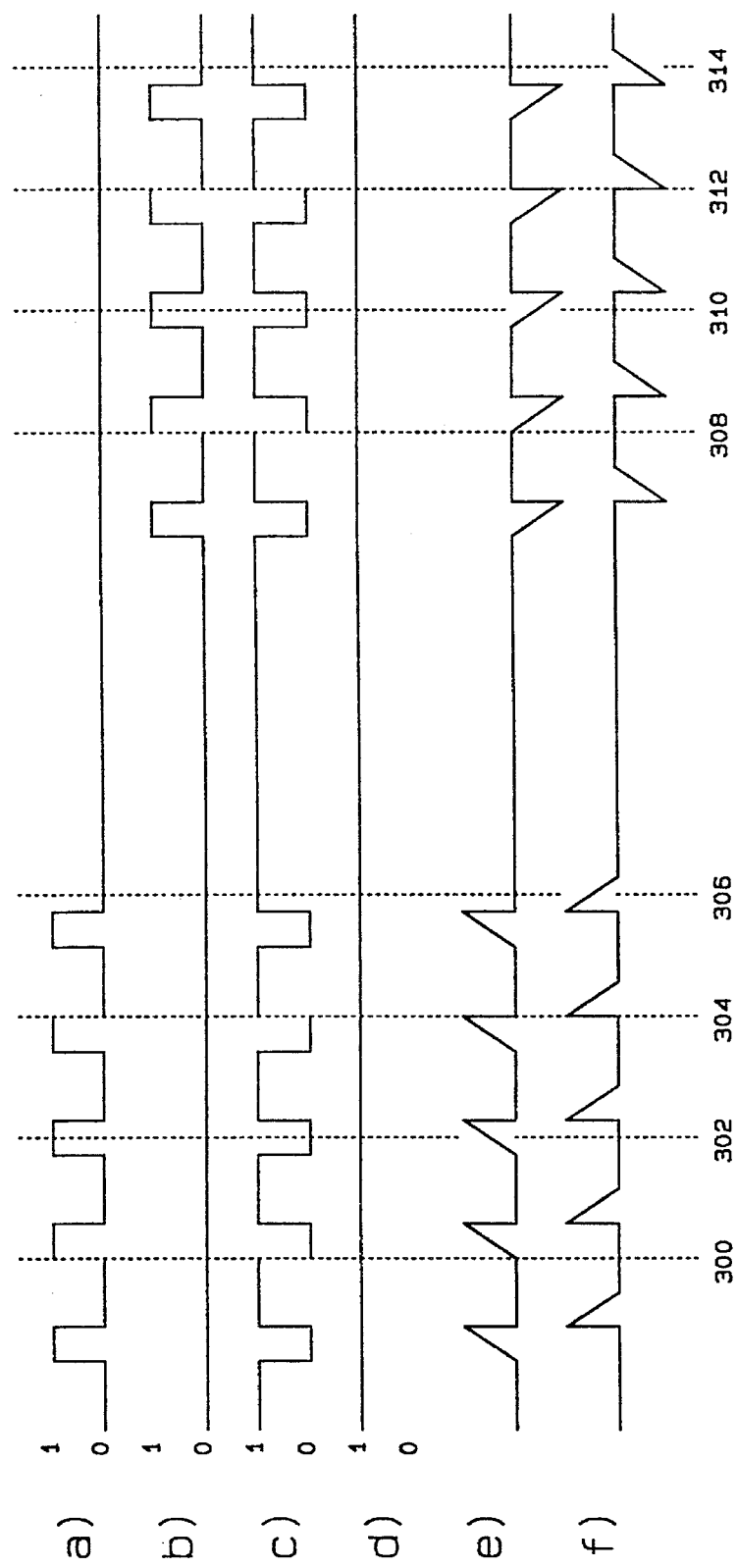
FIG. 3 shows relative switching timing when the present invention utilizes a reactance for a variable impedance transformation.

FIG. 3 shows relative timing of energy transfer via the reactance to the load impedance when the desired output is not within power supply voltage or current limitations. As in FIG. 2, waveforms A and B represent activation of devices 101 and 103 in FIG. 1, respectively, and waveforms C and D show activation of devices 102 and 104, respectively in FIG. 1. Waveform E depicts energy ingress to the reactance 105; waveform F depicts energy egress, or transfer from reactance 105 to the load impedance. Waveforms E and F therefore show current in the case of an inductance and voltage in the case of a capacitance. For a fixed load impedance 106, waveform F directly represents power delivered to the load impedance.

Continuing the reference to FIG. 3, at time point 300 devices 101 and 104 are asserted with devices 102 and 103 turned off, resulting in an energy transfer from the positive power supply to the reactance, seen at time 302 in waveform E. At subsequent time 304, device 101 is switched off with devices 102 and 104 asserted, allowing the energy stored in the reactance to be transferred into the load impedance, as seen at time 306 in waveform F. Although the power extracted from the reactance will approach that stored therein; the voltage/current ratio, or impedance, of the charging period is isolated from that of the discharge period. The level of voltage or current available for transfer to the load impedance may thereby rise to exceed the limitation of the power supply.

The right hand portion of FIG. 3 indicates how a negative excursion is transferred from the reactance to the load impedance. At time period 308, devices 103 and 104 are asserted while devices 101 and 102 are turned off, causing energy transfer from the negative power supply to the reactance, seen at time 310 in waveform E. At subsequent time 312, device 101 is switched off with devices 102 and 104 asserted, allowing the energy stored in the reactance to be transferred into the load impedance, as seen at time 314 in waveform F. Again, with proper timing, the voltage or current available may exceed the limitations of the power supply.

Figure 4:
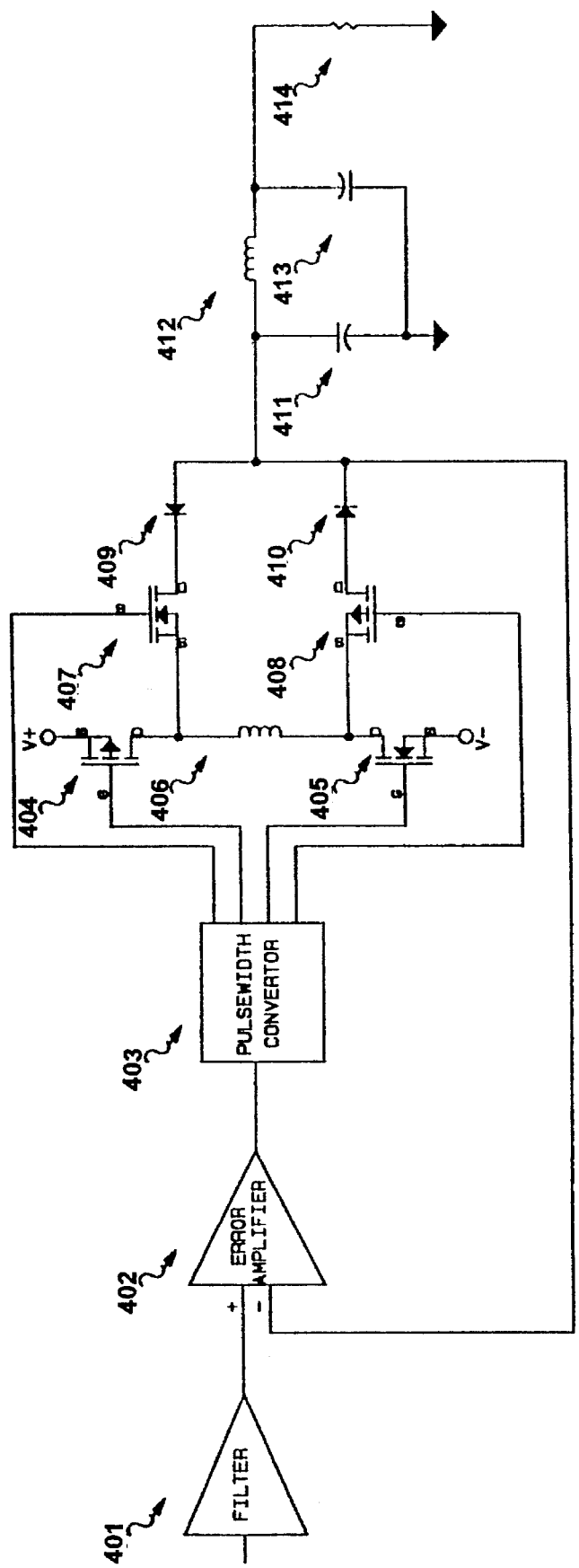
FIG. 4 depicts a preferred embodiment of the present invention in a voltage amplifying application.

FIG. 4 depicts a typical embodiment of the present invention in a voltage amplifying application. It should be noted that in this configuration, unlike those depicted in FIG. 1, either power supply input Vt or V− may be grounded to allow operation from a single supply. Anti-aliasing filter 401 is used to remove all frequency components exceeding the desired passband. Error amplifier 402 serves to null switching time errors to an average value approaching zero. Pulsewidth convertor 403 serves to convert the derived error into pulsewidth signals required by the output stage. The magnitude of the incoming error, which may be expressed as voltage, current, or power, is directly converted into a pulse width which is output on the appropriate path to cause an amplifier output opposite the sign of the error. This yields outputs to devices 404, 407, 405, and 408 for which typical waveforms are shown in FIGS. 2 and 3.

Each of the preceding three sections 401, 402, and 403 may be implemented using either an analog or a digital approach. For example, filter 401 and error amplifier 402 may be implemented with commercially available LF347 operational amplifiers, and pulsewidth convertor 403 may be implemented with the combination of a ramp generator, LM319 voltage comparator, and PAL16L8 logic circuit. Alternatively, filter 401 may be implemented as a digital lowpass; error amplifier 402 may be implemented as an integrating counter controlled by amplifier output; and pulsewidth convertor 403 may be implemented as a signed divide-by-N counter.

Switching transistors 404, 405, 407, and 408 in FIG. 4 are implemented as power field effect transistors. Devices 404 and 405 are used to transfer power into the inductance 406, as well as to facilitate the transfer of energy into load impedance 414. Switching transistors 407 and 408 serve to transfer power from the inductance 406 to the load impedance 414. Diodes 409 and 410 direct the energy flow in the desired polarities, and capacitors 411 and 413, in conjunction with inductor 412, serve to filter switching frequency components from the output.

I claim:

1. A switching amplifier output stage capable of performing a variable-impedance transformation on an input signal and coupling the output bidirectionally to a load impedance said output stage being adapted for use in conjunction with an external power source and a pulsewidth converter operative to generate pulsewidth-modulated signals representative of said input signal, said output stage comprising:

a reactance;

a first coupling circuit of gated switches controlled by said pulsewidth converter, said first coupling circuit being operative to transfer energy from said power source to said reactance;

a second coupling circuit of gated switches controlled by said pulsewidth converter, said second coupling circuit being operative to transfer energy stored in said reactance to said load impedance.

2. The switching amplifier output stage of claim 1 wherein said power source is comprised of a single polarity.

3. The switching amplifier output stage of claim 1 wherein said power source is comprised of positive and negative polarities.

4. The switching amplifier output stage of claim 1 wherein said input signal is substantially analog.

5. The switching amplifier output stage of claim 1 wherein said input signal is substantially digital.

6. The switching amplifier output stage of claim 1 wherein said reactance is an inductance.

7. The switching amplifier output stage of claim 1 wherein said reactance is a capacitance.

8. The switching amplifier output stage of claim 1 wherein said gated switches are field-effect transistors.

9. The switching amplifier output stage of claim 1 further comprising an error amplifier operative to reduce timing errors by subtracting output amplitude errors from the input to said pulsewidth converter.

10. The switching amplifier output stage of claim 1 wherein said second coupling circuit provides a balanced output.

11. The switching amplifier output stage of claim 1 wherein said second coupling circuit provides an unbalanced output.

12. The switching amplifier output stage of claim 1 wherein said second coupling circuit is operative to transfer energy bidirectionally from said power source to said load impedance.

13. A method of performing a variable-impedance transformation on an input to a switching amplifier and coupling the output power from the amplifier to a load impedance, comprising the steps of:

converting said input to a plurality of pulsewidth-modulated signals;

energizing a reactance in accordance with said pulsewidth-modulated signals using power derived from a source other than said input;

bidirectionally coupling the energy from said reactance to said load impedance in accordance with said pulsewidth-modulated signals.

14. The method of claim 13 wherein said step of energizing said reactance includes energizing an inductor.

15. The method of claim 13 wherein said step of energizing said reactance includes energizing a capacitor.

16. The method of claim 13, wherein said input is an analog signal.

17. The method of claim 13, wherein said input is a digital signal.

18. A switching amplifier output stage capable of performing a variable-impedance transformation on an input signal and coupling the output power to a load impedance, said output stage being adapted for use in conjunction with positive and negative power supplies and a pulsewidth convertor operative to generate pulsewidth-modulated signals representative of said input signal, said output stage comprising:

a reactance having a first terminal and a second terminal;

a first p-channel field-effect transistor having a source, a drain and a gate, the source being connected to said positive power supply, the drain being connected to said first terminal of said reactance, and the gate being controlled by one of said pulsewidth-modulated signals;

a first n-channel field-effect transistor having a source, a drain and a gate, the source being connected to said second terminal of said reactance, and the gate being controlled by one of said pulsewidth-modulated signals;

a second p-channel field-effect transistor having a source, a drain and a gate, the source being connected to said first terminal of said reactance, the drain being connected to said load impedance, and the gate being controlled by one of said pulsewidth-modulated signals;

a second n-channel field-effect transistor having a source, a drain and a gate, the source being connected to said second terminal of said reactance, the drain being connected to said load impedance, and the gate being controlled by one of said pulsewidth-modulated signals; and an error amplifier operative to reduce timing errors by aligning the switching of said pulsewidth-modulated signals with said output.

19. The switching amplifier output stage of claim 16 wherein said reactance is an inductance.

20. The switching amplifier output stage of claim 18 wherein said reactance is a capacitance.

* * * * *

UNITED STATES PATENT AND TRADEMARK OFFICE
CERTIFICATE OF CORRECTION

PATENT NO.  : 5,610,553
DATED       : March 11, 1997
INVENTOR(S) : Larry Kirn

It is certified that error appears in the above-indentified patent and that said Letters Patent is hereby corrected as shown below:

Column 2, line 65:  Replace "lead" with --load--.

Column 2, line 67:  Replace "lead" with --load--.

Signed and Sealed this

Eighteenth Day of November 1997

Attest:

Attesting Officer

BRUCE LEHMAN

Commissioner of Patents and Trademarks